US009648673B2

(12) United States Patent
Pickard et al.

(10) Patent No.: US 9,648,673 B2
(45) Date of Patent: May 9, 2017

(54) LIGHTING DEVICE WITH SPATIALLY SEGREGATED PRIMARY AND SECONDARY EMITTERS

(75) Inventors: Paul Kenneth Pickard, Morrisville, NC (US); Gerald H. Negley, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 12/941,012

(22) Filed: Nov. 5, 2010

(65) Prior Publication Data

US 2012/0112614 A1 May 10, 2012

(51) Int. Cl.

| | |
|---|---|
| ***H01L 33/50*** | (2010.01) |
| ***H05B 33/08*** | (2006.01) |
| ***H01J 1/62*** | (2006.01) |
| ***H01J 1/72*** | (2006.01) |
| ***F21V 29/505*** | (2015.01) |
| ***F21K 9/233*** | (2016.01) |
| *F21V 29/74* | (2015.01) |
| *F21V 29/77* | (2015.01) |
| *F21Y 101/00* | (2016.01) |
| *F21Y 115/10* | (2016.01) |
| *F21Y 107/60* | (2016.01) |

(Continued)

(52) U.S. Cl.

CPC ......... *H05B 33/0803* (2013.01); *F21K 9/233* (2016.08); *F21V 29/505* (2015.01); *H01J 1/62* (2013.01); *H01J 1/72* (2013.01); *F21V 29/74* (2015.01); *F21V 29/773* (2015.01); *F21Y 2101/00* (2013.01); *F21Y 2107/60* (2016.08); *F21Y 2113/10* (2016.08); *F21Y 2113/13* (2016.08); *F21Y 2115/10* (2016.08)

USPC ........................................................... 313/46

(58) Field of Classification Search

CPC .......... F21V 9/16; F21V 19/04–19/047; F21V 33/0028; F21Y 2111/008

See application file for complete search history.

(56) References Cited

U.S. PATENT DOCUMENTS

| | | | |
|---|---|---|---|
| 4,918,487 | A | 4/1990 | Coulter |
| 5,813,753 | A | 9/1998 | Vriens et al. |
| 5,838,247 | A | 11/1998 | Bladowski |

(Continued)

FOREIGN PATENT DOCUMENTS

| | | | | |
|---|---|---|---|---|
| DE | 10/2007/041896 A1 | 3/2009 | | |
| DE | 102007041896 A1 * | 3/2009 | ......... | H01L 25/0756 |

(Continued)

OTHER PUBLICATIONS

Co-pending U.S. Appl. No. 12/905,054, filed Oct. 14, 2010.

(Continued)

*Primary Examiner* — Mariceli Santiago

(74) *Attorney, Agent, or Firm* — Withrow & Terranova, P.L.L.C.; Vincent K. Gustafson

(57) ABSTRACT

A lighting device includes at least one first electrically activated emitter, at least one lumiphor support element comprising a lumiphoric material spatially segregated from the first electrically activated emitter and arranged to receive at least a portion of emissions from the first electrically activated emitter, and at least one second electrically activated emitter disposed on or adjacent to the at least one lumiphor support element. First and second electrically activated emitters having different peak wavelengths may be in conductive with first and second device-scale heat sinks, respectively.

53 Claims, 6 Drawing Sheets

(51) Int. Cl.

*F21Y 113/10* (2016.01)
*F21Y 113/13* (2016.01)

(56) References Cited

U.S. PATENT DOCUMENTS 5,959,316 A 9/1999 Lowery
6,155,699 A 12/2000 Miller et al.
6,234,648 B1 5/2001 Borner et al.
6,252,254 B1 6/2001 Soules et al.
6,350,041 B1 2/2002 Tarsa et al.
6,414,801 B1 * 7/2002 Roller ........................... 362/240
6,576,930 B2 6/2003 Reeh et al.
6,577,073 B2 6/2003 Shimizu et al.
6,600,175 B1 7/2003 Baretz et al.
6,635,363 B1 10/2003 Duclos et al.
6,692,136 B2 2/2004 Marshall et al.
6,809,347 B2 10/2004 Tasch et al.
6,841,804 B1 1/2005 Chen et al.
6,871,982 B2 3/2005 Halman et al.
6,936,857 B2 8/2005 Doxsee et al.
6,939,481 B2 9/2005 Srivastava et al.
6,963,166 B2 11/2005 Yano et al.
7,005,679 B2 2/2006 Tarsa et al.
7,029,935 B2 4/2006 Negley et al.
7,061,454 B2 6/2006 Sasuga et al.
7,070,300 B2 7/2006 Harbers et al.
7,144,131 B2 12/2006 Rains
7,213,940 B1 5/2007 Van De Ven et al.
7,265,488 B2 9/2007 Ng et al.
7,360,937 B2 4/2008 Han et al.
7,365,485 B2 4/2008 Fukasawa et al.
7,456,499 B2 11/2008 Loh et al.
7,564,180 B2 7/2009 Brandes
7,614,759 B2 11/2009 Negley
7,663,152 B2 2/2010 Bierhuizen et al.
7,758,214 B2 7/2010 Lee et al.
8,337,030 B2 * 12/2012 Pickard ................ B60Q 1/0052 362/227
2002/0015013 A1 2/2002 Ragle
2002/0084748 A1 7/2002 Ayala et al.
2003/0127660 A1 7/2003 Bawendi et al.
2004/0012027 A1 1/2004 Keller et al.
2004/0165381 A1 8/2004 Waters
2004/0217364 A1 11/2004 Tarsa et al.
2004/0218387 A1 11/2004 Gerlach
2005/0057917 A1 3/2005 Yatsuda et al.
2005/0093430 A1 5/2005 Ibbetson et al.
2005/0231953 A1 10/2005 Reeh et al.
2006/0002141 A1 1/2006 Ouderkirk et al.
2006/0012298 A1 1/2006 Lee et al.
2006/0012997 A1 1/2006 Catalano et al.
2006/0072314 A1 4/2006 Rains
2006/0105482 A1 5/2006 Alferink et al.
2007/0063321 A1 * 3/2007 Han et al. ..................... 257/675
2007/0137074 A1 6/2007 Van de Ven
2007/0139920 A1 6/2007 Van de Ven
2007/0170447 A1 7/2007 Negley et al.
2007/0171145 A1 7/2007 Coleman
2007/0223219 A1 9/2007 Medendorp et al.
2007/0236911 A1 10/2007 Negley
2007/0267983 A1 11/2007 Van de Ven
2007/0274063 A1 11/2007 Negley
2007/0274080 A1 11/2007 Negley
2007/0278503 A1 12/2007 Van de ven
2007/0278934 A1 12/2007 Van de Ven
2007/0279440 A1 12/2007 Negley
2007/0280624 A1 12/2007 Negley
2008/0030993 A1 2/2008 Narendran et al.
2008/0049438 A1 2/2008 Bloemen et al.
2008/0054281 A1 3/2008 Narendran et al.
2008/0084685 A1 4/2008 Van de Ven
2008/0088248 A1 4/2008 Myers
2008/0089053 A1 4/2008 Negley
2008/0094829 A1 4/2008 Narendran et al.
2008/0105887 A1 5/2008 Narendran et al.
2008/0106895 A1 5/2008 Van de Ven
2008/0112170 A1 5/2008 Trott et al.
2008/0117500 A1 5/2008 Narendran et al.
2008/0130285 A1 6/2008 Negley
2008/0130298 A1 6/2008 Negley
2008/0136313 A1 6/2008 Van de Ven
2008/0198572 A1 8/2008 Medendorp
2008/0231169 A1 9/2008 Hata et al.
2008/0259589 A1 10/2008 Van de Ven
2008/0278928 A1 11/2008 Van de Ven
2008/0278940 A1 11/2008 Van de Ven
2008/0304260 A1 12/2008 Van de Ven
2008/0304261 A1 12/2008 Van de Ven
2008/0309255 A1 12/2008 Myers
2009/0002986 A1 1/2009 Medendorp, Jr. et al.
2009/0008573 A1 * 1/2009 Conner ...................... 250/459.1
2009/0021926 A1 1/2009 Wang et al.
2009/0050908 A1 2/2009 Yuan et al.
2009/0059580 A1 3/2009 Kwon
2009/0103293 A1 4/2009 Harbers et al.
2009/0108269 A1 4/2009 Negley
2009/0161354 A1 * 6/2009 Hsu et al. ..................... 362/227
2009/0184616 A1 7/2009 Van de Ven
2009/0184666 A1 7/2009 Myers
2009/0250710 A1 10/2009 Negley
2010/0020532 A1 1/2010 Negley
2010/0102697 A1 4/2010 Van de Ven
2010/0177509 A1 7/2010 Pickard
2010/0290208 A1 * 11/2010 Pickard ................ B60Q 1/0052 362/84
2011/0101383 A1 * 5/2011 Hermann ............ H01L 25/0756 257/88

FOREIGN PATENT DOCUMENTS

EP 1566848 A2 8/2005
EP 2072886 A2 6/2009
JP 2005/332963 A 12/2005
JP 2007-258620 A 10/2007
JP 2008-091140 A 4/2008
JP 2009238734 A 10/2009
KR 10-2006-0102796 A 9/2006
WO WO 2004/068597 A2 8/2004
WO 2004107461 A1 9/2004
WO WO 2004/100226 A2 11/2004
WO WO 2006/061728 6/2006
WO WO 2007/002234 1/2007
WO WO 2007/075742 7/2007
WO WO 2008/023313 2/2008
WO WO 2009/049019 4/2009
WO 2010132150 A1 11/2010

OTHER PUBLICATIONS

Co-pending U.S. Appl. No. 12/941,014, filed Nov. 5, 2010.

International Search Report for International Patent Application No. PCT/US2001/054155 dated Apr. 23, 2011.

High Efficiency, Nitride-Based, Solid-State Lighting, Summary of UCSB Research, Summary of LRC Research, www.lrc.rpi.edu/programs/solidstate/cr_nitridebasedssl.asp, pp. 1-2 (date not known).

Kim et al., "Strongly Enhanced Phosphor Efficiency in GaInN White Light-Emitting Diodes Using Remote Phosphor Configuration and Diffuse Reflector Cup", Japanese Journal of Applied Physics, vol. 44, No. 21, pp. L649-L651 (2007).

LEDs Magazine, Remote phosphor technique improves white LED output, Apr. 14, 2005, http://www.ledsmagazine.com/news/2/4/22, pp. 1.

Narendran, Improved Performance White LED, Nov. 2005, Society of Photo-Optical Instrumentation Engineers, Fifth International Conference on Solid State Lighting, Proccedings of SPIE 5941, pp. 1-7.

Narendran, Improving the performance of mixed-color white LED systems by using scattered photon extraction technique, 2007 Copyright SPIE, The International Sociey of Optical Engineering, Seventh International Conference on Solid State Lighting, Proccedings of SPIE, Aug. 27, pp. 1-2, Sep. 17, 2007.

(56) References Cited

OTHER PUBLICATIONS

Zhu et al., "Optimizing the Performance of Remote Phosphor LED," First International Conference on White LEDS and Solid State Lighting, 2007, pp. 1-5.
Examination Report for European Patent Application No. 11838411.4, mailed Apr. 14, 2015, 5 pages.

* cited by examiner

LIGHTING DEVICE WITH SPATIALLY SEGREGATED PRIMARY AND SECONDARY EMITTERS

FIELD OF THE INVENTION

The present invention relates generally to lighting devices and associated structures for transferring heat generated by lighting devices.

DESCRIPTION OF THE RELATED ART

Lumiphoric materials (also known as lumiphors) are commonly used with electrically activated emitters to produce a variety of emissions such as colored (e.g., non-white) or white light (e.g., perceived as being white or near-white). Electrically activated emitters may be utilized to provide white light (e.g., perceived as being white or near-white), and have been investigated as potential replacements for white incandescent lamps. Such emitters may have associated filters that alter the color of the light and/or include lumiphoric materials that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue light emitting diode ("LED") and a lumiphor such as a yellow phosphor. In the latter case, a portion of the blue LED emissions pass through the phosphor, while another portion of the blue LED emissions is downconverted to yellow, and the blue and yellow light in combination provide light that is perceived as white. Another approach for producing white light is to stimulate phosphors or dyes of multiple colors with a violet or ultraviolet LED source.

LEDs (including both organic and inorganic light emitting diodes) are solid state electrically activated emitters that convert electric energy to light, and generally include one or more active layers of semiconductor material sandwiched between oppositely doped layers. When bias is applied across doped layers, holes and electrons are injected into one or more active layers, where they recombine to generate light that is emitted from the device. Laser diodes are solid state emitters that operate according to similar principles.

A representative example of a white LED lamp includes a package of a blue LED chip (e.g., made of InGaN and/or GaN) combined with a lumiphoric material such as a phosphor (typically YAG:Ce) that absorbs at least a portion of the blue light (first peak wavelength) and re-emits yellow light (second peak wavelength), with the combined yellow and blue emissions providing light that is perceived as white or near-white in character. If the combined yellow and blue light is perceived as yellow or green, it can be referred to as 'blue shifted yellow' ("BSY") light or 'blue shifted green' ("BSG") light. Addition of red spectral output from an emitter or lumiphoric material may be used to increase the warmth of the aggregated light output. The integration of red LEDs into a blue LED BSY ("BSY+R") lighting device improves color rendering and better approximates light produced by incandescent lamps.

Many modern lighting applications require high power emitters to provide a desired level of brightness. High power emitters can draw large currents, thereby generating significant amounts of heat. Conventional binding media used to deposit lumiphoric materials such as phosphors onto emitter surfaces typically degrade and change (e.g., darken) in color with exposure to intense heat. Degradation of the medium binding a phosphor to an emitter surface shortens the life of the emitter structure. When the binding medium darkens as a result of intense heat, the change in color has the potential to alter its light transmission characteristics, thereby resulting in a non-optimal emission spectrum. Limitations associated with binding a lumiphoric material (e.g., a phosphor) to an emitter surface generally restrict the total amount of radiance that can be applied to the lumiphoric material.

In order to increase reliability and prolong useful service life of a lighting device including a lumiphoric material, the lumiphoric material may be physically separated from an electrically activated emitter. Separation of the lumiphor element permits the electrically activated emitter to be driven with higher current and thereby produce a higher radiance. By using an electrically activated emitter in conjunction remote lumiphor, the efficacy of a lighting device can be improved. FIG. 1 is a schematic cross-sectional representation of a conventional lighting device 100 having a lumiphoric material (i.e., phosphor) arranged on a lumiphor support element 110 that is spatially segregated from at least one electrically activated emitter 120 (e.g., blue LED). The electrically activated emitter(s) 120 are mounted on or over a metal core printed circuit board ("MCPCB") or other substrate 125 for thermal management. Angled side walls 115 extending upward along an emissive surface of the emitter(s) 120 may include a highly reflective (e.g., 98-99% reflective) diffuse white material. The lumiphor element (e.g., disc) 110 is arranged above the emitter(s) 120 with an air gap therebetween. A specular reflector 105 directs the emissions generated by and passing through the lumiphor in a desired direction. Traditional construction may utilize a glass disc for the lumiphor support element 110 that is coated with phosphor material (e.g., Calculite or Fortimo from Koninklijke Philips Electronics N.V., Netherlands).

As indicated previously, it is known to supplement emissions from primary blue LEDs and yellow phosphors with red spectral output, such as may be generated by supplemental red LEDs or red phosphors, to generate warmer combined emissions that more closely resemble incandescent light. Use of red LEDs is often preferable to use of red phosphors in such context, such as to promote greater efficacy and/or controllability. The use of red supplemental LEDs in combination with high-power primary blue LEDs, however, creates additional problems. Red LEDs include active regions typically formed of Group III phosphide (e.g., (Al,In,Ga)P) material, in contrast to blue LEDs, which include active regions typically are formed of Group III nitride materials (e.g., represented as (Al,In,Ga)N, including but not limited to GaN). Group III phosphide materials typically exhibit substantially less temperature stability than Group III nitride materials. Due to their chemistry, red LEDs lose a significant portion (e.g., 40-50%) of their efficacy when operating at 85° C. versus operating at a cold condition (i.e., room temperature or less). When red and blue LEDs are affixed to a common substrate or in thermal communication with a common heatsink, heat emanating from the blue LEDs will increase the temperature of the red LEDs. To maintain a relatively constant color point utilizing a device including a Group III-nitride-based blue LED (e.g., as part of a BSY emitter) and Group III-phosphide based red LED, current to the Group III-phosphide based red LED emitter must be altered as temperature increases because of the different temperature responses of the blue and red LED.

Such current reduction results in reduction in total flux from the combination of emitters at a desired color point, limiting utility of the device.

In consequence, the art continues to seek improvements in light emitting devices that include many of the advantages associated with use of high output emitters, but which also have the capacity to produce a warmer light at high flux.

SUMMARY OF THE INVENTION

The present invention relates generally to high output lighting devices and structures for managing heat transfer, including primary and secondary electrically activated emitters that are spatially segregated and/or insubstantially thermally coupled relative to one another.

In one aspect, the invention relates to a lighting device comprising: at least one first electrically activated emitter; at least one lumiphor support element comprising a lumiphoric material, wherein the lumiphor support element is spatially segregated from the first electrically activated emitter, and is arranged to receive at least a portion of emissions from the first electrically activated emitter; and at least one second electrically activated emitter disposed on or adjacent to the at least one lumiphor support element.

In another aspect, the invention relates to a lighting device comprising: at least one first electrically activated emitter having at least one first peak wavelength; a first device-scale heat sink in conductive thermal communication with the at least one first electrically activated emitter; at least one second electrically activated emitter having at least one second peak wavelength; and a second device-scale heat sink in conductive thermal communication with the at least one second electrically activated emitter.

In another aspect, any of the foregoing aspects, and/or various separate aspects and features as described herein, may be combined for additional advantage.

Other aspects, features and embodiments of the invention will be more fully apparent from the ensuing disclosure and appended claims.

DETAILED DESCRIPTION

Figure 1:
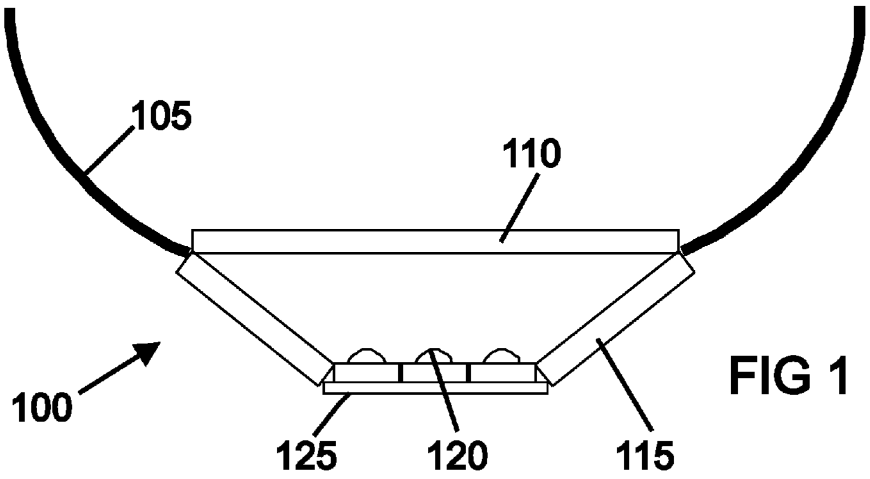
FIG. 1 is a schematic side cross-sectional view of a conventional lighting device including a remote lumiphoric material.

The present invention relates to high output lighting devices and associated structures for transferring heat generated by lighting devices. In various specific embodiments disclosed herein, lighting devices include primary and secondary electrically activated emitters that are spatially segregated from, and/or in insubstantial conductive thermal communication with, one another. At least one lumiphor may also be spatially segregated from the primary electrically activated emitters and arranged to receive at least a portion of the emissions from the primary electrically activated emitters.

In one embodiment, a lighting device includes one or more (e.g., GaN-based) blue LEDs as primary electrically activated emitters, at least one lumiphor (e.g., yellow phosphor) spatially segregated from the blue LEDs, and one or more (e.g., AlInGaP-based) red LEDs as secondary electrically activated emitters, wherein the red LEDs are spatially segregated from the blue LEDs and/or in insubstantial thermal communication with, the blue LEDs.

Spatial segregation (and/or other arrangement including use of interposing thermally insulating materials, preferably resulting in limited or insubstantial conductive thermal communication) between at least one lumiphor and a primary electrically activated emitter is desirable to enhance stability and longevity of the at least one lumiphor, and to permit the electrically activated emitter to be driven at a higher current, thereby generating higher flux and increasing utility of a lighting device.

Spatial segregation (and/or other arrangement including use of interposing thermally insulating materials, preferably resulting in limited or insubstantial conductive thermal communication) between at least one secondary (e.g., Group III-phosphide based) electrically activated emitter and at least one primary (e.g., Group III-nitride based) electrically activated emitter enables greater flux from the combined primary and secondary emitters at a desired color point, thereby increasing utility of a lighting device.

In one embodiment, a lumiphor support element (arranged to be spatially segregated from at least one primary electrically activated emitter) includes at least one secondary electrically activated emitter in an edge-pumped configuration, with at least one secondary electrically activated emitter arranged to emit light into at least a portion of the lumiphor support element.

In one embodiment, a lumiphor support element (arranged to be spatially segregated from at least one primary electrically activated emitter) is arranged to support at least one secondary electrically activated emitter thereon or thereover, with the at least one secondary electrically activated emitter arranged to emit light away from the lumiphor support element (e.g., in a target direction as part of combined emissions from various emitters and/or lumiphors of a lighting device).

In one embodiment, first and second electrically activated emitters having different peak wavelengths (e.g., blue and red) are in conductive thermal communication with first and second device-scale heat sinks, respectively, with the device-scale heat sinks being separated by an air gap or at least one insulating material. Providing electrically activated emitters in conductive thermal communication with different heat sinks may enable emitters of different colors to operate at different temperatures. In certain embodiments, at least one first electrically activated emitter and at least one second electrically activated emitter are controllable independently of one another, such as with at least one control circuit arranged to independently regulate electrical current to the respective first and second electrically activated emitters, in order to regulate operating temperature, output color, color temperature, or any other desired parameter. In one embodiment including a plurality of primary electrically activated emitters, different emitters of the plurality of primary electrically activated emitters may be controllable independently of one another (e.g., to permit color and/or color temperature of a lighting device to be varied or otherwise controlled); similarly, individual emitters of a plurality of secondary electrically activated emitters adapted to emit different peak wavelengths may be controllable independently of one another.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude the presence of one or more elements.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers. Various types of electrically activated emitters generate steady state thermal loads upon application thereto of an operating current and voltage. In the case of solid state emitters, such steady state thermal load and operating current and voltage are understood to correspond to operation of the solid state emitter at a level that maximizes emissive output at an appropriately long operating life (preferably at least about 5000 hours, more preferably at least about 10,000 hours, more preferably still at least about 20,000 hours).

Electrically activated emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by adding such materials to encapsulants, adding such materials to lenses, by embedding or dispersing such materials to lumiphor support elements, or other methods. Other materials, such as dispersers and/or index matching materials, may be included in or on a lumiphor support medium.

Various embodiments include lumiphoric materials and lumiphor support elements that are spatially segregated from one or more electrically activated emitters. In certain embodiments, such spatial segregation may involve separation of a distance of preferably at least about 1 mm, more preferably at least about 2 mm, more preferably at least about 5 mm, and more preferably at least about 10 mm. In certain embodiments, conductive thermal communication between a spatially segregated lumiphoric material and one or more electrically activated emitters is not substantial. Lumiphoric materials may be supported by or within one or more lumiphor support elements, such as (but not limited to) glass layers or discs, optical elements (defined infra), or layers of similarly translucent or transparent materials capable of being coated with or embedded with lumiphoric material. In one embodiment, lumiphoric material (e.g., phosphor) is embedded or otherwise dispersed in a body of the lumiphor support element. If a lumiphoric material is arranged on an inner surface of a lumiphor support element, then lumiphor emissions may be subject to at least partial reflection by (or between) the inner and outer surfaces of the lumiphor support element. Anti-reflective coatings or materials may be provided on any of the inner and outer surfaces of the lumiphor support element. A lumiphor support element may be supplemented or integrated with at least one optical element.

The term "optical element" as used herein refers to any acceptable optical filter, optical reflector, or combination thereof as may be useful to reflect and/or filter selected wavelengths of light that may otherwise (i.e., in the absence of such element) emanate from or be received from an electrically activated emitter or lumiphoric material. Optical reflectors may include interference reflectors, and further include dichroic mirrors that reflect certain wavelengths while allowing others to pass through. Optical filters include interference filters, and further include dichroic filters that restrict or block certain wavelengths while allowing other wavelengths to pass. Optical reflectors may be used to prevent a substantial amount of light converted by a lumiphoric material from being incident on an underlying electrically activated emitter. An optical element may comprise a glass disc having a filter or mirror (e.g., dichroic filter or dichroic mirror) on one face and optionally an anti-reflective coating on the other. An anti-reflective coating may be provided in a lighting device including at least one electrically activated emitter and a spatially segregated lumiphor, to reduce reflection of stimulated emissions from the lumiphor in a direction toward the at least one electrically activated emitter. Addition of a reflective (e.g., angled) surface arranged between at least one electrically activated emitter and a spatially segregated lumiphor further promotes transmission of the majority of emissions in a direction toward and/or through the lumiphor.

An optical element of a lighting device as described herein may be arranged to inhibit light emitted by at least second electrically activated emitter from being incident upon at least one first electrically activated emitter, with such first and second electrically activated emitters desirably having peak wavelengths that differ from one another.

In one embodiment including (A) at least one blue LED (as a primary electrically activated emitter), (B) a yellow phosphor (as a lumiphor) spatially segregated from the at least one blue LED, and (C) at least one red LED (as a secondary electrically activated emitter) arranged to emit light into a transmission element, an optical element (e.g., a dichroic filter) that allows passage of wavelengths up to 500 nm may be provided proximate to (e.g., along an inner surface of) a lumiphor support element to ensure that emissions from the red LED are not transmitted in a direction of the underlying blue LED. Without such an optical element, phosphor converted yellow light and red light from the edge lit lens may be undesirably reflected or transmitted toward the at least one blue LED (and possibly absorbed).

The term "device-scale heat sink" as used herein refers to a heat sink suitable for dissipating heat substantially all of the steady state thermal load from at least one chip-scale solid state emitter to an ambient environment, with a device-scale heat sink preferably having a minimum major dimension (e.g., height, width, diameter) of about 5 cm or greater, more preferably about 10 cm or greater. A device-scale heat sink differs from a "chip-scale heat sink" which, as used herein or otherwise in the art, refers to a heat sink that is smaller than and/or has less thermal dissipation capability than a device-scale heat sink.

Lighting devices as described herein include device-scale heat sinks for one or more solid state emitters, with such heat sinks preferably being exposed to an ambient environment external to the lighting device and adapted to dissipate substantially all of the steady state thermal load of one or more solid state emitters to the ambient environment (e.g., an ambient air environment). Such heat sinks may be sized and shaped to dissipate significant steady state thermal loads (preferably at least about 1 watt, more preferably at least about 2 watts, more preferably at least about 4 watts, and more preferably at least about 10 watts) to an ambient air environment, without causing excess solid state emitter junction temperatures that would detrimentally shorten service life of such emitter(s). For example, operation of a solid state emitter at a junction temperature of 85° C. may provide an average solid state emitter life of 50,000 hours, while temperatures of 95° C., 105° C., 115° C., and 125° C. may result in average service life durations of 25,000 hours, 12,000 hours, 6,000 hours, and 3,000 hours, respectively. In one embodiment, a device-scale heat sink of a lighting device as described herein is adapted to dissipate a steady state thermal load at least about 2 Watts (more preferably at least about 4 Watts, still more preferably at least about 10 watts) in an ambient air environment of about 35° C. while maintaining a junction temperature of the solid state emitter at or below about 95° C. (more preferably at or below about 85° C.). The term "junction temperature" in this context refers to an electrical junction disposed on a solid state emitter chip, such as a wirebond or other contact. Size, shape, and exposed area of a device-scale heat sink as disclosed herein may be adjusted to provide desired thermal performance.

In one embodiment, a lighting device such as a LED light bulb includes at least one of a lumiphor support element and a cover adapted to provide both light transmission and heat dissipation utility. Such lumiphor support element and/or cover may comprise part or all of a heat sink in conductive thermal communication with at least one electrically activated emitter. Typical LED light bulbs include conventional glass or polymeric covers (e.g., diffusers and/or lenses), with such covers generally constituting thermal insulators. Heating of conventional polymeric covers may be avoided to prevent discoloration and/or deformation of such material. To provide enhanced heat dissipation utility, in certain embodiments according to the present invention, at least a portion of a lumiphor support element and/or a cover for a lighting device (e.g., LED light bulb) may be formed of a material having reasonably high visible spectrum transmittance (e.g., at least about 80%, more preferably at least about 85%, more preferably at least about 90%, more preferably at least about 95%, more preferably at least about 97% of at least one wavelength in the visible range) together with high thermal conductivity (i.e., at a temperature of about 25° C. or 298° K, since thermal conductivity is temperature dependent). Such high thermal conductivity may be at least about 25 W/(m·° K), more preferably at least about 50 W/(m·° K), more preferably at least about 75 W/(m·° K), more preferably at least about 100 W/(m·° K), more preferably at least about 150 W/(m·° K), and more preferably at least about 200 W/(m·° K), including ranges of the foregoing minimum values optionally bounded by an upper threshold thermal conductivity of up to about 210 W/(m·° K). Examples of materials exhibiting both (a) visible spectrum transmittance within one or more of the foregoing ranges, and (b) high thermal conductivity within one or more of the foregoing ranges, include, but are not limited to, sintered silicon carbide, crystalline silicon carbide, and high thermal conductivity glass (e.g., comprising indium tin oxide). Thermally conductive and optically transmissive lumiphor support elements and/or covers for lighting devices may be formed by any desirable techniques, including sintering (heating of powdered precursor material, often with an additional binder material) and/or machining. In one embodiment, a thermally conductive cover for a LED light bulb serves as an optical diffuser or at least one lens. In one embodiment, a lumiphor support element and/or a thermally conductive cover for a lighting device (e.g., a LED light bulb) includes or has associated therewith a lumiphoric material arranged to receive emissions from the at least one LED having a first peak wavelength and re-emit emissions having a second peak wavelength.

Various embodiments of the present invention are directed to lighting devices that may include at least one electrically activated emitter and at least one lumiphoric material, arranged to output aggregated emissions including three, four, or more color peaks in the visible range. Such peaks may include a short wavelength blue peak (e.g., having a dominant wavelength in a range of from about 380 nm to about 470 nm); a long wavelength blue peak (e.g., having a dominant wavelength in a range of from about 471 to about 499 nm), a green peak (e.g., having a dominant wavelength in a range of from about 500 to about 559 nm), a yellow peak (e.g., having a dominant wavelength in a range of from about 560 nm to about 595 nm), and/or a red and/or orange peak (e.g., having a dominant wavelength in a range of from about 600 nm to about 700 nm). The foregoing peaks in the visible range may be provided by any suitable combinations of electrically activated emitters and/or lumiphors.

As noted previously, it is beneficial to provide at least one lumiphor support element that is spatially segregated from at least one first (e.g., primary) electrically activated emitter, with the lumiphor support element supporting at least one lumiphor (optionally multiple lumiphors) arranged to receive at least a portion of emissions from the at least one first electrically activated emitter. At least one second (e.g., secondary) electrically activated emitter may also be spatially segregated (and/or insubstantially coupled with respect to conductive thermal communication) relative to the at least one first electrically activated emitter. The at least one second electrically activated emitter may be, for example, disposed on or adjacent to the at least one lumiphor support element. For example, a lumiphor support may include an inner surface proximate to one or more primary electrically activated emitter(s) and include an outer surface distal from the one or more primary electrically activated emitter(s), wherein the at least one secondary electrically activated emitter is disposed on or over the outer surface of the lumiphor support element. A first device-scale heat sink may be provided in conductive thermal communication with the at least one first electrically activated emitter, and a second device-scale heat sink may be provided in conductive thermal communication with the at least one electrically activated emitter.

In one embodiment, multiple lumiphor support elements may be provided, with one or more of the multiple lumiphor support elements being arranged to support and/or receive light from at least one second electrically activated emitter. Multiple lumiphor support elements each may be arranged across an entire width of a light transmissive area, or each arranged across different portions of a light transmissive area.

In one embodiment, a lumiphor support element that is spatially segregated from at least one primary electrically activated emitter may comprise an optically transmissive material having electrical traces patterned thereon or thereover, with the electrical traces arranged to conduct electric current to one or more secondary electrically activated emitters (e.g., optionally arranged in a ring-like shape) supported by the lumiphor support element. The lumiphor support element may comprise a material that is both optically transmissive and thermally conductive, as mentioned hereinabove, to aid in dissipation of heat generated by one or more secondary electrically activated emitters supported by the lumiphor support element.

In one embodiment, at least one second electrically activated emitter may be disposed proximate to a surface or edge of a lumiphor support element. In one embodiment, a lumiphor support element may be arranged to emit light (e.g., from a peripheral portion of a lighting device) into a light distributing element (e.g., a disc or lens), optionally having ridges or other surface features, arranged to distribute light emanating from the at least one second electrically activated emitter in a desired direction to combine with emissions from at least one primary emitter (and preferably to combine with emissions from at least one lumiphor) to yield aggregated emissions of the lighting device.

In one embodiment, a lighting device as described herein may include a diffuser element arranged to receive emissions at least one on: (a) the at least one first electrically activated emitter, (b) the at least one second electrically activated emitter, and (c) the at least one lumiphoric material. In various embodiments, a diffuser is arranged to receive emissions from two, or all three, of the foregoing elements (a), (b), and (c). In certain embodiments, a diffuser may be arranged across substantially all of a light-emitting portion of a lighting device, or arranged across only a portion thereof.

As noted previously, a primary purpose of providing spatial separation between lumiphoric materials and primary electrically activated emitters, and between secondary activated emitters and primary electrically activated emitters, is to reduce conductive thermal communication between such components. Such spatial segregation may be aided, or alternatively provided, by use of thermally insulating materials provided between respective components.

Various aspects of the present invention will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey illustrative aspects of the invention to those skilled in the art. In the drawings, the size and relative sizes of layers and regions may be exaggerated for clarity.

Figure 2:
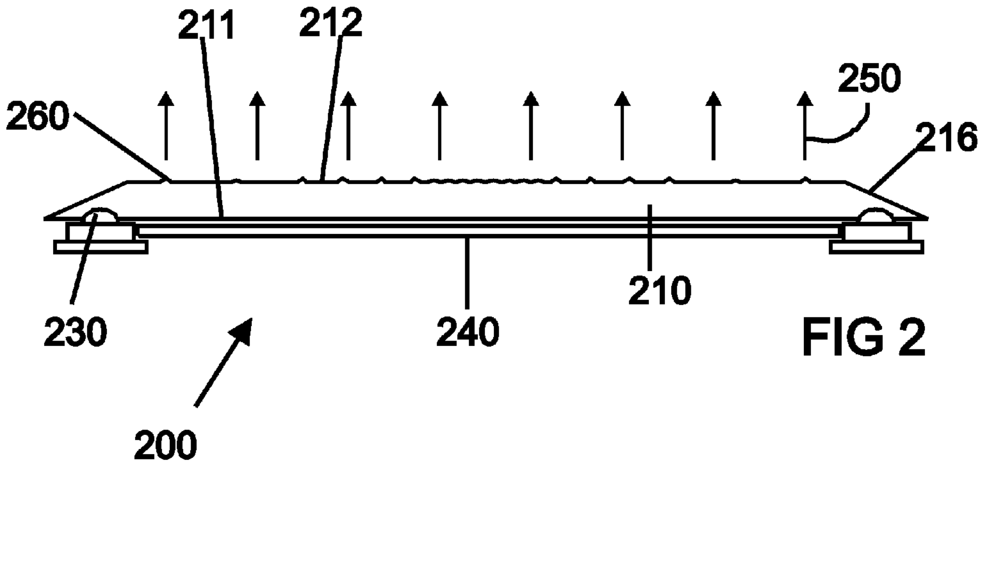
FIG. 2 is a schematic side cross-sectional view of a portion of a lighting device including a lumiphor support element arranged to be lit by secondary electrically activated emitters disposed along an inner surface of the lumiphor support element at the periphery thereof to emit light into the lumiphor support element, with the lumiphor support element including surface features along an outer surface thereof to promote uniform illumination.

FIG. 2 a schematic side cross-sectional view of a lumiphor support and secondary emitter subassembly 200 (useable as part of a lighting device) according to an edge-pumped configuration. A lumiphor support element 210 includes electrically activated emitters 230 disposed along an inner surface 211 the lumiphor support element 210 at the periphery thereof, with the lumiphor support element 210 including surface features 260 (e.g., ridges, involutions, and/or facets, or the like) along an outer surface 212 thereof to promote uniform illumination of the outer surface 212 via the electrically activated emitters 230 and/or lumiphoric material associated with the lumiphor support element 210. The lumiphor support element 210 may include at least one lumiphor arranged along the inner surface 211, along the outer surface 212, or dispersed within the lumiphor support element 210. In one embodiment, the lumiphor support element 210 comprises a yellow phosphor. The lumiphor support and secondary emitter subassembly 200 may be spatially segregated from and positioned over primary electrically activated emitters (not shown) adapted to emit light for reception by the lumiphor material(s), with at least a portion of light generated by the primary electrically activated emitter(s) being absorbed by the lumiphor material(s) to promote re-emission of light having at least one peak wavelength differing from a peak wavelength of the primary electrically activated emitter(s). In one embodiment, the lumiphor support element 210 comprises a glass disc or lens. In one embodiment, the secondary electrically activated emitters 230 include red LEDs arranged for use with one or more primary electrically activated emitter(s) in the form of at least one of a blue LED, a green LED, and an ultraviolet LED.

Along a periphery of the lumiphor support element 210, angled portions 216 may be provided, such as to form an acute angle between the outer surface 212 and the inner surface 211, with a substantially parallel portion of the outer surface 212 being smaller in lateral extent or diameter than the inner surface 211. The angled portions 216 (which may optionally include reflective surfaces to promote reflection and reduce loss of light) are preferably arranged to reflect light transmitted by the secondary electrically activated emitters 230 along a direction substantially parallel or nearly parallel with the inner face 211 and the outer face 212 to promote transmission of light generated by the secondary electrically activated emitters 230 into the interior of the lumiphor support element 210, wherein such light interacts with the surface features 260 to emit such light through the outer surface 212 (e.g., in an outward direction represented by arrows 250). In order to reduce transmission of light from the lumiphor support element 210 through the inner surface 211, an optical element 240 such as a reflector (e.g., reflective white backer) that preferably permits transmission of light emitted by a primary electrically activated emitter (not shown) but reflects light emitted by the secondary electrically activated emitters 230 and/or lumiphoric material associated with the lumiphor support element 210 may be positioned along the inner surface 211 of the lumiphor support element 210, thereby reducing transmission of emissions from the lumiphoric material and/or the secondary electrically activated emitters 230 in a direction toward underlying primary electrically activated emitters (not shown). Although FIG. 2 illustrates the secondary electrically activated emitters 230 as being arranged along peripheral portions of the inner surface 210, such emitters 230 may be optically coupled with the lumiphor support element 210 in any appropriate manner, including along the outer surface 212 or along the edges thereof.

Figure 3:
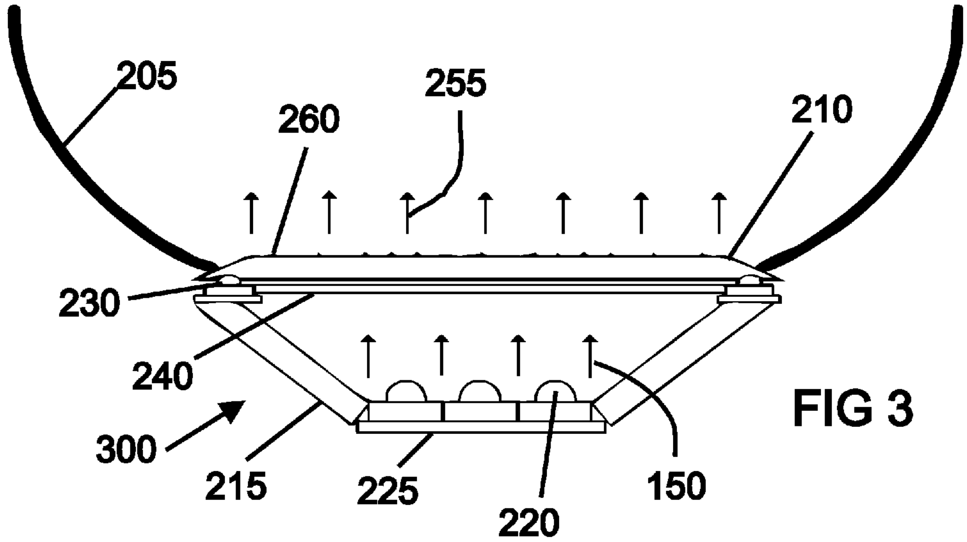
FIG. 3 is a schematic side cross-sectional view of a lighting device incorporating the lumiphor support element and secondary electrically activated emitters of FIG. 2, in combination with primary electrically activated emitters that are spatially segregated from the lumiphor support element and the secondary electrically activated emitters.

FIG. 3 illustrates a lighting device 300 incorporating the lumiphor support and secondary emitter subassembly 200 of FIG. 2. One or more primary electrically activated emitters 120 may be mounted on a metal core printed circuit board or other substrate 225 optionally with at least one submount or intervening structure (not shown) disposed between the electrically activated emitter(s) 220 and the MCPCB or substrate 225. At least one device-scale heatsink (not shown) may be arranged in conductive thermal communication with the MCPCB or substrate 225. The primary electrically activated emitters 220 may be arranged to emit light having a first peak wavelength in a direction (e.g., as indicated by arrows 150) toward the lumiphor support element 210 (that is spatially segregated from the primary emitter(s) 220), wherein at least a portion of the light emanating from the first electrically activated emitters 220 is absorbed by at least one lumiphoric materials associated with (e.g., coated on or dispersed within) the lumiphor support element 210, and re-emitted as light having at least one second peak wavelength that differs from the first peak wavelength. Secondary electrically activated emitters 230 are arranged along peripheral portions of the lumiphor support element 210, and are also spatially segregated from the primary electrically activated emitters 220. A second device-scale heatsink (not shown) may be provided conductive thermal communication with the secondary electrically activated emitters 230.

Spatial segregation between each of the lumiphor support element 210 and the secondary electrically activated emitters 230 may be any suitable distance (e.g., 1 mm, 2 mm, 5 mm, 10 mm, or another distance) that reduces conductive thermal coupling between such elements. Conductive thermal coupling between such components may also be reduced (e.g., further reduced) by providing thermally insulating materials and/or air gaps between the primary electrically activated emitters 220 and at least one of the secondary electrically activated emitters 230 and the lumiphor support element 210. For example, angled walls 215 (preferably reflective in character) may be provided between the primary electrically activated emitters 220 and the secondary electrically activated emitters 230, and such walls 215 may comprise a thermally insulating material to inhibit flow of heat from the primary electrically activated emitters 220 to the secondary electrically activated emitters 230.

The lumiphor support element 210 receives light from each of the first electrically activated emitters 220 and the secondary electrically activated emitters 230, and transmits light (e.g., in the direction shown by arrows 255) including emissions from the second electrically activated emitters 230, emissions from lumiphor material associated with the lumiphor support element 210, and a portion of emissions from the first electrically activated emitters 220. Surface features 260 arranged along an outer surface of the lumiphor support element 210 are arranged to promote uniform illumination of the outer surface 212 via the electrically activated emitters 230 and/or lumiphoric material associated with the lumiphor support element 210. An optical element 240 may be provided to inhibit light converted by the lumiphoric material or from the second electrically activated emitters 230 from being incident on the first electrically activated emitters 120. Aggregated emissions from the lighting device 300 may therefore include at least three wavelength peaks, including emissions from at least one lumiphoric material, one or more primary electrically activated emitters 120, and one or more secondary electrically activated emitters 230.

In various embodiments, multiple lumiphoric materials having different wavelength peaks, multiple primary electrically activated emitters 220 having different wavelength peaks, and/or multiple secondary electrically activated emitters 230 having different wavelength peaks may be provided, such that aggregated emissions from the lighting device 300 may include four, five, six, or more wavelength peaks that differ from one another. In one embodiment, the secondary electrically activated emitters 230 may be controllable independently of the primary electrically activated emitters 210, such as to permit color and/or color temperature of the lighting device 300 to be varied or otherwise controlled.

In one embodiment, the primary (or first) electrically activated emitters 220 include at least one blue LED, the secondary (or second) electrically activated emitters 230 include at least one red LED, and the lumiphoric material associated with the lumiphor support element 210 comprises a yellow phosphor arranged to be stimulated by the at least one blue LED. Emissions from the at least one red LED may be used to enhance warmth of the combined emission of the blue LED and yellow phosphor. Additional and/or different colors may be utilized for any of the foregoing.

In certain embodiments, a lumiphor support element may be arranged to support at least one secondary electrically activated emitter thereon or thereover, with the at least one secondary electrically activated emitter arranged to emit light away from the lumiphor support element.

Figure 4:
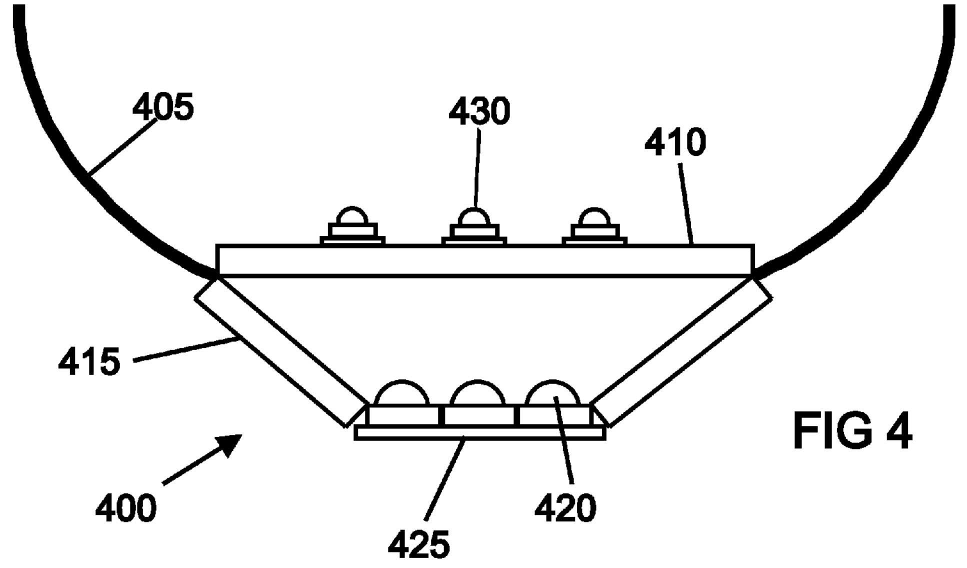
FIG. 4 is a schematic side cross-sectional view of a lighting device including a lumiphor support element that is spatially segregated from primary electrically activated emitters, with secondary electrically activated emitters arranged on an outer surface of the lumiphor support element.

FIG. 4 illustrates a lighting device 400 including one or more (preferably multiple) secondary electrically activated emitters 430 disposed over a lumiphor support element 410 that is spatially segregated from one or more (e.g., underlying) primary electrically activated emitters 420. The primary electrically activated emitters 420 may be mounted on or over a metal core printed circuit board (MCPCB) or other substrate 425, optionally with at least one submount or intervening structure (not shown) disposed between the primary electrically activated emitters 420 and the MCPCB or other substrate 425. The lighting device 400 may include walls 415 comprising a reflective material; such walls 415 may also comprise a thermally insulating material to reduce thermal conduction between the primary electrically activated emitters 420 and the secondary electrically activated emitters 430. As illustrated, the secondary electrically activated emitters 430 may be arranged with paths of beams emitted by the primary electrically activated emitters 420. Although such arrangement reduces transmission of flux from the primary electrically activated emitters 420, such arrangement also enhances mixing of light of (i) one or more peak wavelengths emitted by the primary electrically activated emitters 420 and (ii) one or more peak wavelengths emitted by the secondary electrically activated emitters 430.

In one embodiment, electrical traces (not shown) may be formed on or over the lumiphor support element 410, with the secondary electrically activated emitters 430 arranged in contact with such traces to receive electric current. The lumiphor support element 410 may be formed of a thermally conductive and optically transmissive material (e.g., having a thermal conductivity of at least 25 W/(m·° K) at about 25° C. and a transmittance of at least about 80%, or other thermal conductivity and transmittance thresholds as disclosed herein), to permit the lumiphor support element 410 conduct heat from the secondary electrically activated emitters 430 as well as to transmit light emitted by the primary electrically activated emitters 420 and lumiphoric material associated with the lumiphor support element 410. Lumiphoric material may be arranged on or along either surface of the lumiphor support element, or may be arranged within (e.g., dispersed within) the lumiphor support element 410.

In one embodiment, distribution of emissions of each of the primary electrically activated emitters 420, the secondary electrically activated emitters 430, and the lumiphoric material associated with the lumiphor support element 410 is roughly Lambertian, such that light may not be mixed in the near field, but may be sufficiently mixed in the far field, with a majority of light in the aggregated beam being reflected off a (e.g., segmented) reflector 405. If far field mixing is inadequate, then various diffusing, scattering, or other color mixing structures may be added to promote mixing in the near field of emissions from the primary and secondary electrically activated emitters 420, 430. Such structures may be arranged across substantially all of a light-emitting portion of a lighting device, or arranged across only a portion thereof.

Figure 5:
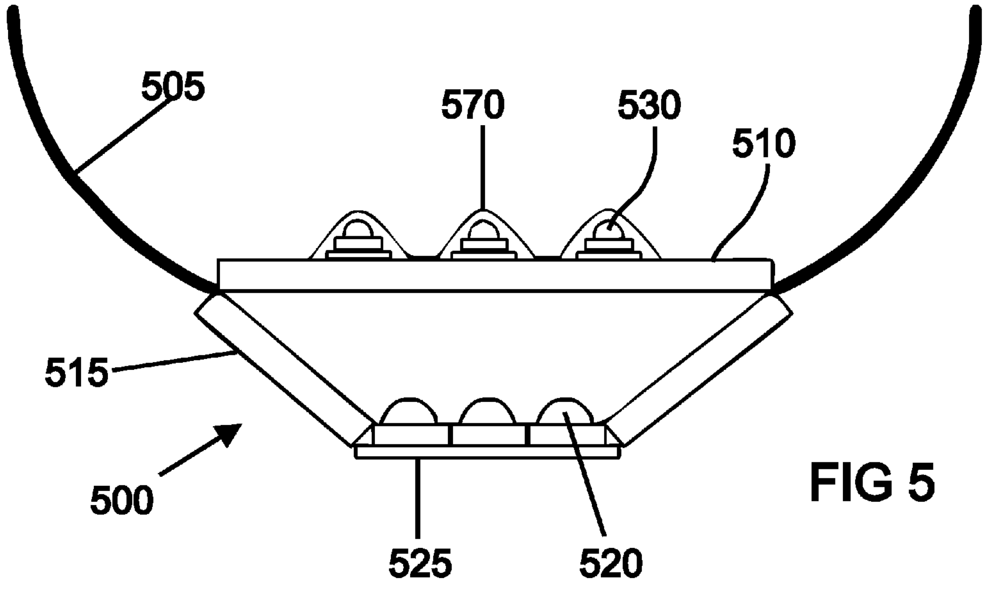
FIG. 5 is a schematic side cross-sectional view of a lighting device similar to the device illustrated in FIG. 4, with the addition of a diffuser arranged over the secondary electrically activated emitters proximate to an outer surface of the lumiphor support element.

FIG. 5 illustrates a lighting device 500 similar in character to the lighting device 400 depicted in FIG. 4, with the addition of a diffuser element 570 over the secondary electrically activated emitters 530. The lighting device 500 includes primary electrically activated emitters 520 arranged over a printed circuit board or other substrate 525, and a lumiphor support element 510 spatially segregated from the primary electrically activated emitters 520 with angled (and preferably reflective) walls 515 disposed therebetween. Secondary electrically activated emitters 530 are arranged on or over an outer surface of the lumiphor support element 510, and a reflector 505 is disposed around and above the lumiphor support element 505 to direct aggregated emissions from the lighting device 500 in a desired direction. The diffuser element 570 is preferably arranged to diffuse emissions of the primary and secondary electrically activated emitters 520, 530 (each having different peak wavelengths) in the near field, thereby promoting very uniform color appearance in the far field. As illustrated, the diffuser element 570 may be arranged over just the secondary electrically activated emitters 530 without spanning the entire width of the lumiphor support element 510. In one embodiment, a diffuser element may be arranged over secondary electrically activated emitters and substantially the entirety of a lumiphor support element. The diffuser element 570 may be arranged to receive emissions from any of: (a) the primary electrically activated emitters 520, (b) the secondary electrically activated emitters 530, and (c) lumiphoric material associated with the lumiphor support element 510. In one embodiment, the diffuser element 570 comprises a plurality of domes (optionally interconnected to one another via connecting portions) arranged to cover the secondary electrically activated emitters 530. A diffuser element 570 may be fabricated by any desired method including injection molding. Optimization of the shape of the diffuser element 570, including any domes thereof, may entail balancing color uniformity and physical size (height) and potential spill into the field angle of emissions from the secondary electrically activated emitters. If a portion of the diffuser element 570 is too high, then it could potentially block near field emissions of the second electrically activated emitters 530. In one embodiment, the primary electrically activated emitters 520 comprise at least one blue LED, the secondary electrically activated emitters 530 comprise at least one red LED, and the at least one lumiphoric material associated with the lumiphor support element 510 comprises a yellow phosphor.

Figure 6:
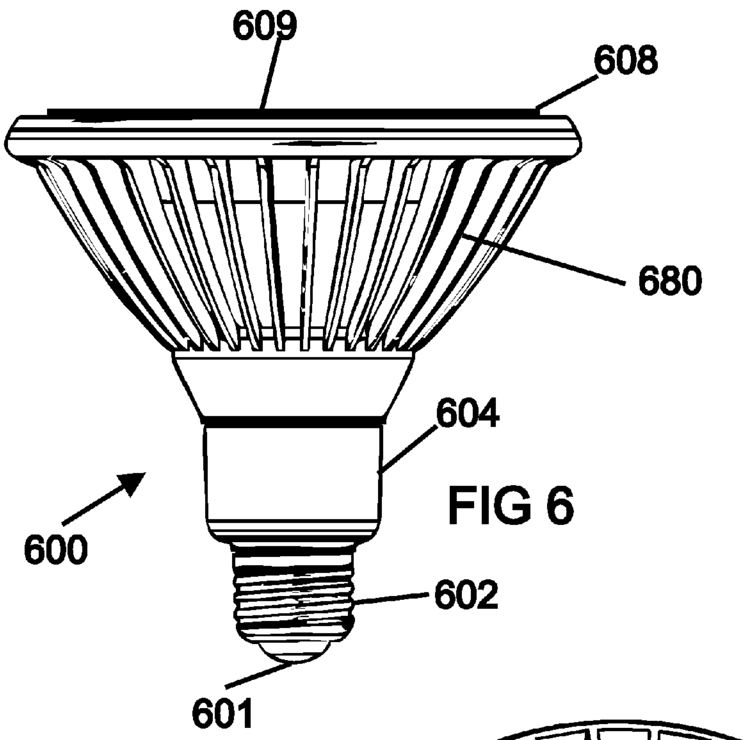
FIG. 6 is an elevation view of a reflector-type light bulb including a device-scale heat sink with multiple fins along an exterior portion of the bulb to dissipate heat to an ambient environment.

FIG. 6 illustrates a side perspective view of a reflector-type light bulb 600 according to one embodiment of the present invention including a device-scale heat sink 680 including multiple fins arranged along an exterior portion thereof. The device-scale heat sink 680 is in conductive thermal communication with at least one electrically activated emitter and is arranged to dissipate heat to an ambient environment external to the light bulb 600. The light bulb 600 includes a (threaded) lateral electrical contact 602 and a foot electrical contact 601 arranged along one end thereof. (Although the light bulb 600 is illustrates as having a screw-type Edison base, it is to be appreciated that lighting devices and light bulbs as disclosed herein may embodying any suitable type(s) of electrical contacts known in the art.) A body portion 604 (e.g., optionally containing electrical circuit elements, such as driver and/or ballast circuits for the lighting device 600) is arranged between the contacts 601, 602 and the heatsink 680. A lens 608 may be arranged along a light emitting end 609. Such lens 608 may serve to focus, direct, scatter, mix, or otherwise affect light emitted from the light emitting end 609, as well as protect components internal to the light bulb 600. The lens 608 may comprise a material that is not only optically transmissive but also thermally conductive (such as described hereinabove), such that the lens 608 may serve as a device-scale heat sink or a portion thereof. In one embodiment, the lens 608 comprises an optically transmissive and thermally conductive material, and is in conductive thermal communication with the external device-scale heatsink 680. In another embodiment, the lens 608 comprises an optically transmissive and thermally conductive material, but is thermally isolated from the external device-scale heatsink 680, such as by an air gap and/or an interposing thermally insulating material. In one embodiment, the external device-scale heatsink 680 is in conductive thermal communication with one or more primary electrically activated emitters, and the lens 608 (which comprises an optically transmissive and thermally conductive material) is separately in conductive thermal communication with one or more secondary electrically activated emitters that are spatially segregated from the one or more primary electrically activated emitters.

Figure 7:
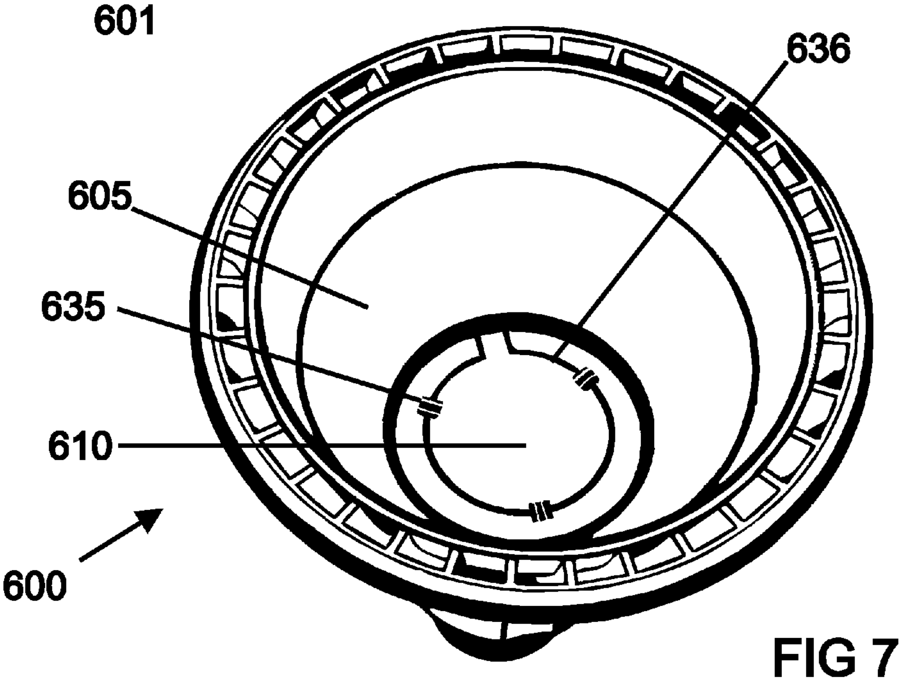
FIG. 7 is an upper perspective view of a light bulb according to the design of FIG. 6 in a first state of fabrication, including electrical traces defined on an outer surface of a lumiphor support element to supply current to secondary electrically activated emitters arrangeable thereon.
Figure 8:
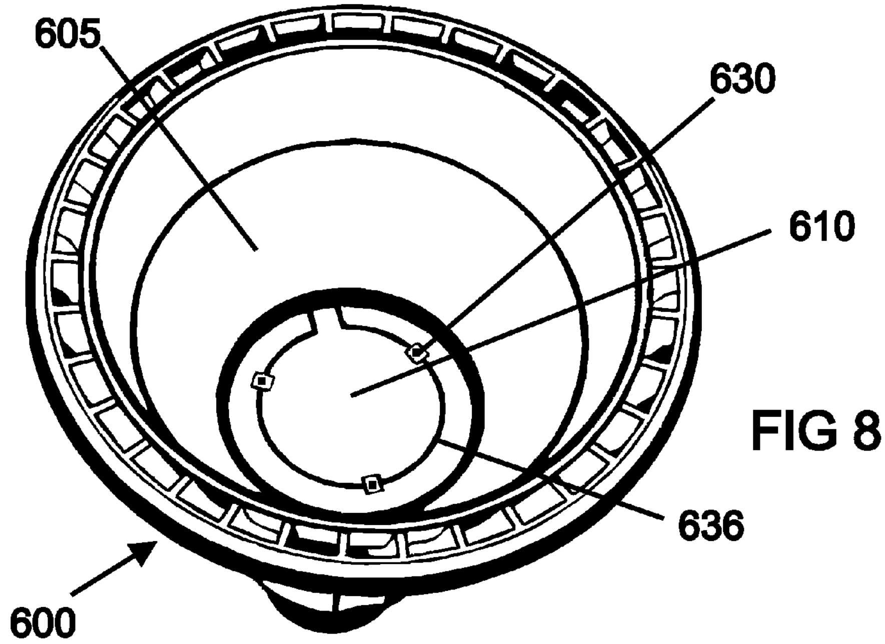
FIG. 8 is an upper perspective view of the light bulb according to the design of FIGS. 6-7 in a second state of fabrication, including secondary emitters arranged over the outer surface of the lumiphor support element to receive current from the electrical traces.
Figure 9:
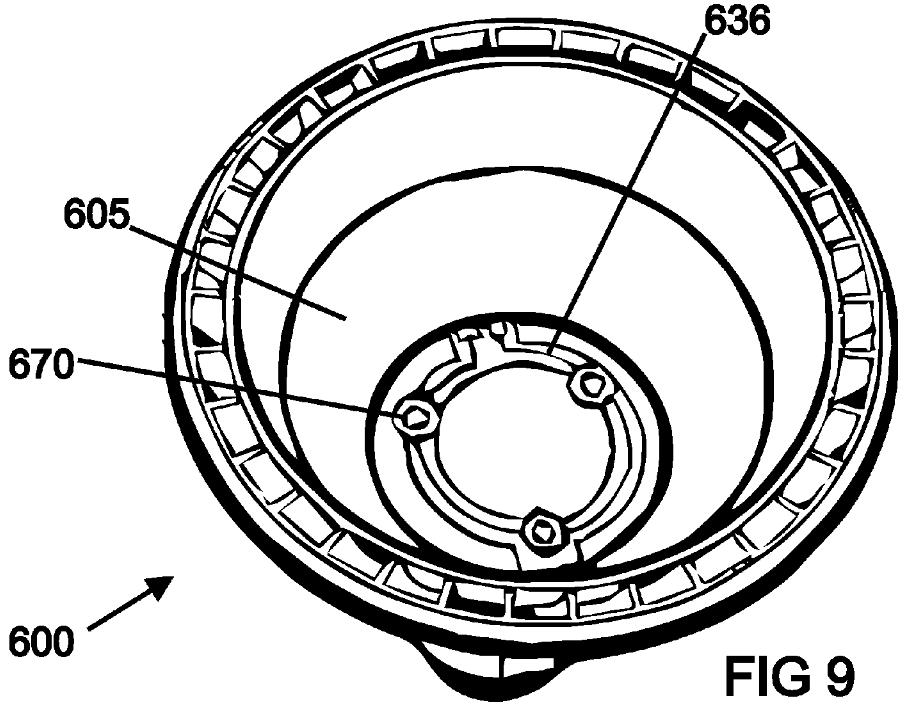
FIG. 9 is an upper perspective view of the light bulb according to the design of FIGS. 6-8 in a third state of fabrication, following addition of a diffuser arranged over the secondary emitters and proximate to the outer surface of the lumiphor support element.

FIGS. 7-9 are upper perspective views of one or more light bulbs according to the design of FIG. 6 in different states of fabrication.

FIG. 7 is an upper perspective view of a light bulb 600 according to the design of FIG. 6 in a first state of fabrication, including electrical traces 636 and bond pads 635 defined on an outer surface of a lumiphor support element 610 (which is spatially segregated from underlying primary electrically activated emitters (not shown)) to supply current to secondary electrically activated emitters (not shown)

arrangeable on the bond pads 635. A reflector 605 extending upward and radially outward is disposed proximate to the lumiphor support element 610 and arranged to direct light toward the light emitting end 609 (as depicted in FIG. 6).

FIG. 8 is an upper perspective view of a light bulb 600 according to the design of FIGS. 6-7 in a second state of fabrication, including secondary emitters 630 arranged over the outer surface of the lumiphor support element 610 to receive current from electrical traces 636 and bond pads (such as shown in FIG. 7). A reflector 605 extends upward and radially outward proximate to the lumiphor support element 610.

FIG. 9 is an upper perspective view of the light bulb 600 according to the design of FIGS. 6-8 in a third state of fabrication, following addition of at least one diffuser element 670 arranged over the secondary emitters (i.e., the secondary electrically activated emitters 630 shown in FIG. 8) arranged over the outer surface of the lumiphor support element 610. As shown in FIG. 9, the diffuser element 670 may be approximately circular in shape (thereby covering electrical trace segments that are arranged in a circular shape (such as shown in FIGS. 7-8)), and may include localized dome shapes arranged to cover each of the secondary emitters. The diffuser element 670 is provided to aid in mixing of emissions from the secondary electrically activated emitters 630) with emissions of the primary electrically activated emitters and/or emissions from at least one lumiphor associated with the lumiphor support element 610.

Figure 10:
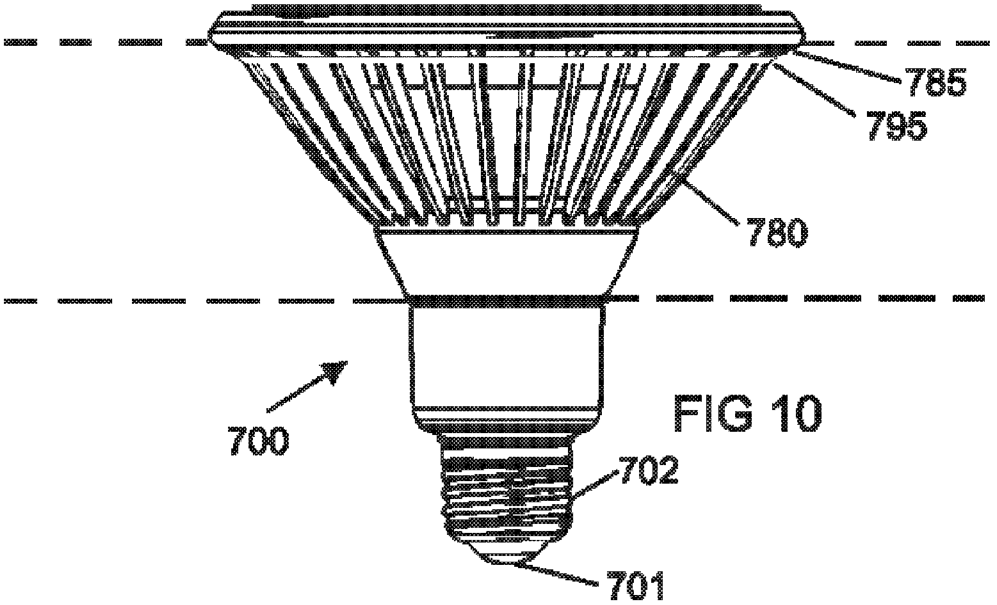
FIG. 10 is an elevation view of a reflector-type light bulb including first and second separate device-scale heat sinks each including multiple fins along an exterior portion of the bulb to dissipate heat to an ambient environment.

FIG. 10 illustrates a lighting device 700 including a first device-scale heat sink 780 and a second device-scale heat sink 785 separated by a gap and/or insulation 795 according to one embodiment of the present invention. The first device-scale heat sink 780 is preferably in conductive thermal communication with one or more primary electrically activated emitters, and the second device-scale heat sink 780 is preferably in separate conductive thermal communication with one or more secondary electrically activated emitters. The gap and/or insulation 795 provides a thermal barrier between the first device-scale heat sink 780 and the second device-scale heat sink 785. Relative sizes of the first and second heat sinks 780, 785 may be selected to dissipate thermal energy according to the expected heat output of the primary and secondary electrically activated emitters. In one embodiment, the second device-scale heat sink 785 may be in conductive thermal communication with an optically transmissive and thermally conductive lens arranged along a light emitting end of the lighting device 700.

Figure 11:
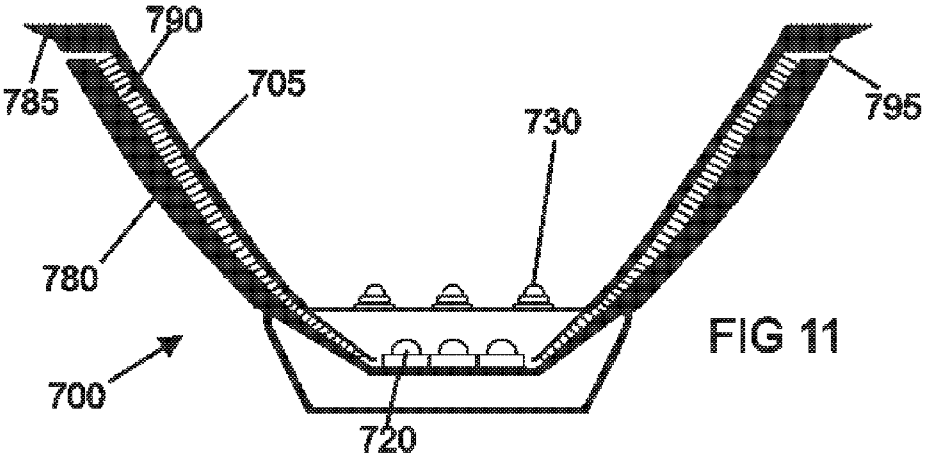
FIG. 11 is a schematic side cross-sectional view of a portion of the lighting device of FIG. 10, depicting the first and second device-scale heat sinks in separate conductive thermal communication with the primary electrically activated emitters and the secondary electrically activated emitters, respectively.

FIG. 11 is a schematic side cross-sectional view of a portion of the lighting device of FIG. 10, with the portion represented by the dashed lines shown in FIG. 11. Referring to FIG. 11, the primary electrically activated emitters 720 are arranged on a substrate and in conductive thermal communication with a first device-scale heat sink 780. Secondary electrically activated emitters 730 are spatially segregated from the primary electrically activated emitters 720 (e.g., on a lumiphor support element) and in conductive thermal communication with the second device-scale heat sink 785, with an insulating material (or alternatively an air gap) 790 disposed between the respective first and second device scale heat sinks 780, 785. Each of the first and second device scale heat sinks 780, 785 is arranged along an external surface of the lighting device 700 to dissipate heat to an ambient environment, and either or both of the first and second device scale heat sinks 780, 785 may include multiple fins. Providing primary and secondary electrically activated emitters 720, 730 in conductive thermal communication with different heat sinks 780, 785 may enable emitters of different colors to operate at different temperatures.

One embodiment of the present invention includes a light fixture including at least one lighting structure as disclosed herein. In one embodiment, a light fixture includes a plurality of lighting devices as disclosed herein. In one embodiment, a light fixture is arranged for recessed mounting in ceiling, wall, or other surface. In one embodiment, a light fixture is arranged for track mounting. A lighting device may be may be permanently mounted to a structure or vehicle, or constitute a manually portable device such as a flashlight.

In one embodiment, an enclosure comprises an enclosed space and at least one lighting structure or light fixture including such structure as disclosed herein, wherein upon supply of current to a power line, the at least one lighting device illuminates at least one portion of the enclosed space. In another embodiment, a structure comprises a surface or object and at least one lighting device as disclosed herein, wherein upon supply of current to a power line, the lighting device illuminates at least one portion of the surface or object. In another embodiment, a lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost.

It is to be appreciated that any of the elements and features described herein may be combined with any one or more other elements and features.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A lighting device comprising:

at least one first electrically activated emitter supported by a substrate or submount;

at least one lumiphor support element comprising a lumiphoric material, wherein the at least one lumiphor support element is spatially segregated from the at least one first electrically activated emitter and the substrate or submount, and is arranged to receive at least a portion of emissions from the at least one first electrically activated emitter; and at least one second electrically activated emitter supported by the at least one lumiphor support element;

wherein the lighting device comprises at least one of the following features (i) to (vii):

(i) the at least one lumiphor support element comprises a material having a thermal conductivity of at least 25 W/(m·° K) at about 25° C. and a transmittance of at least about 80%;

(ii) a first device-scale heat sink is in conductive thermal communication with the at least one first electrically activated emitter, a second device-scale heat sink is in conductive thermal communication with the at least one second electrically activated emitter, and each of the first device-scale heat sink and the second device-scale heat sink is exposed to an ambient environment external to the lighting device;

(iii) a first device-scale heat sink is in conductive thermal communication with the at least one first electrically activated emitter, a second device-scale heat sink is in conductive thermal communication with the at least one second electrically activated emitter, and at least one of the first device-scale heat sink and the second device-scale heat sink comprises a material having a thermal conductivity of at least 25 W/(m·° K) at about 25° C. and a transmittance of at least about 80%;

(iv) an optical element is positioned between the at least one first electrically activated emitter and the at least one second electrically activated emitter, and is arranged to inhibit light emitted by the at least one second electrically activated emitter from being incident upon the at least one first electrically activated emitter;

(v) the at least one lumiphor support element comprises an inner surface proximate to the at least one first electrically activated emitter and comprises an outer surface distal from the at least one first electrically activated emitter, wherein the at least one second electrically activated emitter is disposed on or over the outer surface of the at least one lumiphor support element;

(vi) the lumiphoric material is arranged to output emissions including a peak wavelength in a range of from 560 nm to 595 nm; or (vii) the at least one first electrically activated emitter is not in conductive thermal communication with the at least one second electrically activated emitter.

2. The lighting device of claim 1, wherein the at least one second electrically activated emitter is disposed proximate to a surface or edge of the at least one lumiphor support element.

3. The lighting device of claim 2, wherein the at least one second electrically activated emitter is arranged to direct light into at least a portion of the at least one lumiphor support element.

4. The lighting device of claim 2, wherein the at least one second electrically activated emitter is arranged to direct light away from the at least one lumiphor support element.

5. The lighting device of claim 1, wherein the at least one lumiphor support element comprises a material having a thermal conductivity of at least 25 W/(m·° K) at about 25° C. and a transmittance of at least about 80%.

6. The lighting device of claim 1, wherein the at least one first electrically activated emitter is not in substantial conductive thermal communication with the at least one second electrically activated emitter.

7. The lighting device of claim 1, comprising one of features (ii) or (iii), and further comprising at least one of a thermally insulating material and a gap disposed between the first device-scale heat sink and the second device-scale heat sink.

8. The lighting device of claim 1, comprising a first device-scale heat sink in conductive thermal communication with the at least one first electrically activated emitter, and a second device-scale heat sink in conductive thermal communication with the at least one second electrically activated emitter, wherein each of the first device-scale heat sink and the second device-scale heat sink is exposed to an ambient environment external to the lighting device.

9. The lighting device of claim 1, comprising a first device-scale heat sink in conductive thermal communication with the at least one first electrically activated emitter, and a second device-scale heat sink in conductive thermal communication with the at least one second electrically activated emitter, wherein at least one of the first device-scale heat sink and the second device-scale heat sink comprises a material having a thermal conductivity of at least 25 W/(m·° K) at about 25° C. and a transmittance of at least about 80%.

10. The lighting device of claim 9, wherein at least a portion of any of the first device-scale heat sink and the second device-scale heat sink is arranged to receive light emissions from at least one of: (a) the at least one first electrically activated emitter, and (b) the at least one second electrically activated emitter.

11. The lighting device of claim 1, wherein an optical element is positioned between the at least one first electrically activated emitter and the at least one second electrically activated emitter, and is arranged to inhibit light emitted by the at least one second electrically activated emitter from being incident upon the at least one first electrically activated emitter.

12. The lighting device of claim 11, wherein the optical element is selected from the group consisting of optical filters and optical reflectors.

13. The lighting device of claim 1, wherein the at least one lumiphor support element is spatially segregated from the substrate or submount and from the at least one first electrically activated emitter by a distance of at least about 1 mm.

14. The lighting device of claim 1, wherein the at least one lumiphor support element comprises an inner surface proximate to the at least one first electrically activated emitter and comprises an outer surface distal from the at least one first electrically activated emitter, wherein the at least one second electrically activated emitter is disposed on or over the outer surface of the at least one lumiphor support element.

15. The lighting device of claim 1, further comprising a diffuser element arranged to receive emissions from any of: (a) the at least one first electrically activated emitter, (b) the at least one second electrically activated emitter, or (c) the lumiphoric material.

16. The lighting device of claim 1, wherein each of the at least one first electrically activated emitter and the at least one second electrically activated emitter is adapted to output emissions with a peak wavelength in the visible range.

17. The lighting device of claim 1, wherein the lumiphoric material comprises a phosphor.

18. The lighting device of claim 1, wherein the lumiphoric material is arranged to output emissions including a peak wavelength in a range of from 560 nm to 595 nm.

19. The lighting device of claim 1, wherein the at least one first electrically activated emitter is adapted to output emissions having a first peak wavelength, and the lumiphoric material is adapted to emit lumiphor emissions having a second peak wavelength that differs from the first peak wavelength.

20. The lighting device of claim 1, wherein the at least one first electrically activated emitter comprises a plurality of first electrically activated emitters.

21. The lighting device of claim 20, wherein the plurality of first electrically activated emitters comprises at least two of: (a) a light emitting diode having a peak wavelength in a range of from 380 nm to 470 nm, (b) a light emitting diode having a peak wavelength in a range of from 471 nm to 499 nm, and (c) a light emitting diode having a peak wavelength in a range of from 500 nm to 560 nm.

22. The lighting device of claim 1, wherein the at least one second electrically activated emitter comprises a plurality of second electrically activated emitters.

23. The lighting device of claim 1, wherein the at least one second electrically activated emitter has a peak wavelength in a range of from 600 nm to 700 nm.

24. The lighting device of claim 1, wherein the lumiphoric material is embedded or dispersed within the at least one lumiphor support element.

25. The lighting device of claim 1, wherein the at least one first electrically activated emitter is not in conductive thermal communication with the at least one second electrically activated emitter.

26. The lighting device of claim 1, wherein the at least one first electrically activated emitter is controllable independently of the at least one second electrically activated emitter.

27. The lighting device of claim 1, wherein the at least one first electrically activated emitter includes an active region comprising a Group III-nitride material, and the at least one second electrically activated emitter includes an active region comprising a Group III-phosphide material.

28. A lighting device comprising:

at least one first electrically activated emitter having at least one first peak wavelength;

a first device-scale heat sink in conductive thermal communication with the at least one first electrically activated emitter;

at least one second electrically activated emitter having at least one second peak wavelength; and a second device-scale heat sink in conductive thermal communication with the at least one second electrically activated emitter;

wherein the lighting device comprises at least one of the following features (i) to (vi):

(i) at least one of the first device-scale heat sink and the second device-scale heat sink comprises a material having a thermal conductivity of at least 25 W/(m·° K) at about 25° C. and a transmittance of at least about 80%;

(ii) the lighting device comprises a lumiphor support element that includes a lumiphoric material, and the lumiphor support element comprises an inner surface proximate to the at least one first electrically activated emitter and comprises an outer surface distal from the at least one first electrically activated emitter, wherein the at least one second electrically activated emitter is disposed on or over the outer surface of the lumiphor support element;

(iii) the lighting device comprises a lumiphor support element that includes a lumiphoric material, and the lumiphor support element comprises a material having a thermal conductivity of at least 25 W/(m·° K) at about 25° C. and a transmittance of at least about 80%;

(iv) the lighting device comprises a lumiphor support element that includes a lumiphoric material, and the lumiphoric material is arranged to output emissions including a peak wavelength in a range of from about 560 nm to 595 nm;

(v) each of the first device-scale heat sink and the second device-scale heat sink is exposed to an ambient environment external to the lighting device; or (vi) an optical element is positioned between the at least one first electrically activated emitter and the at least one second electrically activated emitter, and is arranged to inhibit light emitted by the at least one second electrically activated emitter from being incident upon the at least one first electrically activated emitter.

29. The lighting device of claim 28, wherein the at least one first electrically activated emitter is not in conductive thermal communication with the at least one second electrically activated emitter.

30. The lighting device of claim 28, further comprising at least one of a thermally insulating material and a gap disposed between the first device-scale heat sink and the second device-scale heat sink.

31. The lighting device of claim 28, wherein each of the first device-scale heat sink and the second device-scale heat sink is exposed to an ambient environment external to the lighting device.

32. The lighting device of claim 28, wherein at least one of the first device-scale heat sink and the second device-scale heat sink comprises a material having a thermal conductivity of at least 25 W/(m·° K) at about 25° C. and a transmittance of at least about 80%.

33. The lighting device of claim 32, wherein at least a portion of at least one of the first device-scale heat sink and the second device-scale heat sink is arranged to receive emissions from at least one of: (a) the at least one first electrically activated emitter, and (b) the at least one second electrically activated emitter.

34. The lighting device of claim 28, further comprising a diffuser element arranged to receive emissions from any of the at least one first electrically activated emitter and the at least one second electrically activated emitter.

35. The lighting device of claim 28, wherein the lighting device comprises a lumiphor support element that includes a lumiphoric material, and the lumiphor support element comprises a material having a thermal conductivity of at least 25 W/(m·° K) at about 25° C. and a transmittance of at least about 80%.

36. The lighting device of claim 28, comprising one of features (ii) to (iv), wherein the lumiphor support element is spatially segregated from, and is arranged to receive at least a portion of emissions from, the at least one first electrically activated emitter.

37. The lighting device of claim 28, wherein the lighting device comprises a lumiphor support element that includes a lumiphoric material, and the lumiphor support element comprises an inner surface proximate to the at least one first electrically activated emitter and comprises an outer surface distal from the at least one first electrically activated emitter, wherein the at least one second electrically activated emitter is disposed on or over the outer surface of the lumiphor support element.

38. The lighting device of claim 28, comprising one of features (ii) to (iv), wherein the at least one second electrically activated emitter is disposed proximate to a surface or edge of the lumiphor support element.

39. The lighting device of claim 38, wherein the at least one second electrically activated emitter is arranged to direct light into at least a portion of the lumiphor support element.

40. The lighting device of claim 38, wherein the at least one second electrically activated emitter is arranged to direct light away from the lumiphor support element.

41. The lighting device of claim 28, wherein the lighting device comprises a lumiphor support element that includes a lumiphoric material, and the lumiphoric material is arranged to output emissions including a peak wavelength in a range of from about 560 nm to 595 nm.

42. The lighting device of claim 28, comprising one of features (ii) to (iv), wherein the lumiphoric material comprises a phosphor.

43. The lighting device of claim 28, comprising one of features (ii) to (iv), wherein the lumiphoric material is embedded or dispersed within the lumiphor support element.

44. The lighting device of claim 28, wherein an optical element is positioned between the at least one first electrically activated emitter and the at least one second electrically activated emitter, and is arranged to inhibit light emitted by the at least one second electrically activated emitter from being incident upon the at least one first electrically activated emitter.

45. The lighting device of claim 44, wherein the optical element is selected from the group consisting of optical filters and optical reflectors.

46. The lighting device of claim 28, wherein the at least one first electrically activated emitter comprises a plurality of first electrically activated emitters.

47. The lighting device of claim 46, wherein the plurality of first electrically activated emitters comprises at least two of: (a) a light emitting diode having a peak wavelength in a range of from 380 nm to 470 nm, (b) a light emitting diode having a peak wavelength in a range of from 471 nm to 499 nm, and (c) a light emitting diode having a peak wavelength in a range of from 500 nm to 560 nm.

48. The lighting device of claim 28, wherein the at least one second electrically activated emitter comprises a plurality of second electrically activated emitters.

49. The lighting device of claim 28, wherein the at least one second electrically activated emitter has a peak wavelength in a range of from 600 nm to 700 nm.

50. The lighting device of claim 28, wherein the at least one first electrically activated emitter is controllable independently of the at least one second electrically activated emitter.

51. The lighting device of claim 28, wherein the at least one first electrically activated emitter includes an active region comprising a Group III-nitride material, and the at least one second electrically activated emitter includes an active region comprising a Group III-phosphide material.

52. The lighting device of claim 28, comprising one of features (ii) to (iv), wherein the at least one second electrically activated emitter is supported by the lumiphor support element.

53. The lighting device of claim 1, wherein the substrate or submount is non-coplanar with the at least one lumiphor support element.

* * * * *